United States Patent
Genc

(10) Patent No.: US 11,463,087 B2
(45) Date of Patent: Oct. 4, 2022

(54) METHODS AND DEVICES TO GENERATE GATE INDUCED DRAIN LEAKAGE CURRENT SINK OR SOURCE PATH FOR SWITCH FETS

(71) Applicant: pSemi Corporation, San Diego, CA (US)

(72) Inventor: Alper Genc, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/945,283

(22) Filed: Jul. 31, 2020

(65) Prior Publication Data

US 2022/0038099 A1 Feb. 3, 2022

(51) Int. Cl.
*H03K 17/693* (2006.01)
*H03K 17/76* (2006.01)

(52) U.S. Cl.
CPC ........... *H03K 17/693* (2013.01); *H03K 17/76* (2013.01)

(58) Field of Classification Search
CPC ...... H03J 2200/00; H03J 2200/06; H03J 5/00; H03J 5/14; H03K 17/00; H03K 17/005; H03K 17/10; H03K 17/102; H03K 17/162; H03K 17/302; H03K 17/60; H03K 17/687; H03K 17/693; H03K 17/76; H03K 2217/00; H03K 2217/0018; H03K 2217/0036; H03K 2217/0054; H04B 1/00; H04B 1/04; H04W 88/00
USPC ......................................................... 327/408
See application file for complete search history.

(56) References Cited

U.S. PATENT DOCUMENTS

| | | | |
|---|---|---|---|
| 10,044,349 B2 | 8/2018 | Scott et al. | |
| 10,236,872 B1 | 3/2019 | Willard et al. | |
| 10,680,599 B1 | 6/2020 | Syroiezhin et al. | |
| 10,715,133 B1 | 7/2020 | Scott et al. | |
| 2008/0129642 A1 | 6/2008 | Ahn et al. | |
| 2011/0260774 A1* | 10/2011 | Granger-Jones | H03K 17/102 327/427 |
| 2014/0118053 A1* | 5/2014 | Matsuno | H03K 17/693 327/427 |
| 2015/0171860 A1 | 6/2015 | Blin | |

(Continued)

FOREIGN PATENT DOCUMENTS

| | | |
|---|---|---|
| CN | 113810034 A | 12/2021 |
| JP | 2010010728 A | 1/2010 |

(Continued)

OTHER PUBLICATIONS

International Search Report and Written Opinion for International PCT Application No. PCT/US2021/037479 filed on Jun. 15, 2021 on behalf of pSemi Corporation, dated Oct. 7, 2021. 8 pages.

(Continued)

*Primary Examiner* — Thomas J. Hiltunen
*Assistant Examiner* — Dave Mattison
(74) *Attorney, Agent, or Firm* — Steinfl + Bruno LLP

(57) ABSTRACT

Methods and devices to mitigate de-biasing caused by an undesired gate induced drain body leakage current in FET switch stacks are disclosed. The devices utilize diode stacks to generate discharge paths for the undesired current. The disclosed teachings are applicable to both shunt and series implementations of FET switch stacks.

24 Claims, 10 Drawing Sheets

(56) References Cited

U.S. PATENT DOCUMENTS

| | | | | |
|---|---|---|---|---|
| 2015/0341026 | A1* | 11/2015 | de Jongh | H03K 17/161 |
| | | | | 327/382 |
| 2016/0085256 | A1 | 3/2016 | Cam et al. | |
| 2019/0245533 | A1 | 8/2019 | Schleicher et al. | |
| 2019/0305768 | A1 | 10/2019 | Willard et al. | |
| 2019/0305769 | A1 | 10/2019 | Willard et al. | |
| 2020/0119731 | A1* | 4/2020 | Teggatz | H03K 17/689 |
| 2020/0382114 | A1* | 12/2020 | Scott | H03K 17/74 |
| 2021/0391858 | A1 | 12/2021 | Shapiro et al. | |
| 2022/0038092 | A1 | 2/2022 | Genc | |
| 2022/0038097 | A1 | 2/2022 | Genc et al. | |

FOREIGN PATENT DOCUMENTS

| | | |
|---|---|---|
| KR | 100916472 B1 | 9/2009 |
| KR | 102034620 B1 | 11/2019 |
| WO | 2021/257602 A1 | 12/2021 |
| WO | 2022/035603 A1 | 2/2022 |

OTHER PUBLICATIONS

Ex Parte Quayle for U.S. Appl. No. 17/119,840, filed Dec. 11, 2020, on behalf of PSEMI Corporation. Mail Date: Aug. 13, 2021. 8 pages.

Non-Final Office Action for U.S. Appl. No. 16/902,032, filed Jun. 15, 2020 on behalf of PSEMI Corporation, dated Jan. 8, 2021. 15 Pages.

Restriction Requirement for U.S. Appl. No. 17/119,840, filed Dec. 11, 2020 on behalf of PSEMI Corporation, dated May 17, 2021. 6 pages.

International Search Report and Written Opinion for International Application No. PCT/US2021/059387 filed on Nov. 15, 2021 on behalf of PSEMI Corporation dated Mar. 8, 2022. 9 pages.

Non-Final Office Action for U.S. Appl. No. 16/902,032, filed Jun. 15, 2020 on behalf of pSemi Corporation, dated Mar. 29, 2022. 14 Pages.

Final Office Action for U.S. Appl. No. 16/902,032, filed Jun. 15, 2020 on behalf of pSemi Corporation, dated Oct. 15, 2021. 17 Pages.

International Search Report and Written Opinion for International PCT Application No. PCT/US2021/043544 filed on Jul. 28, 2021 on behalf of pSemi Corporation, dated Feb. 8, 2022. 12 Pages.

* cited by examiner

US 11,463,087 B2

METHODS AND DEVICES TO GENERATE GATE INDUCED DRAIN LEAKAGE CURRENT SINK OR SOURCE PATH FOR SWITCH FETS

FIELD

The present disclosure is related to radio frequency (RF) switches, more in particular to methods and devices to generate body current discharge path for field-effect transistor (FET) switches.

BACKGROUND

When designing communication systems, RF switches are generally implemented in stacked configuration due to the large RF power handling requirement of such switch stacks. FIG. 1A shows a prior art field effect transistor (FET) switch stack (100) including a series arrangement of transistors $(T_1, \ldots, T_N)$. The FET switch stack (100) is biased using a body resistive ladder including body resistors $(R_{B1}, \ldots, R_{Bn+1})$, a drain-source resistive ladder including drain-source resistors $(R_{DS1}, \ldots, R_{DSN})$ and a gate resistor structure on the gate side of the transistors as shown. Switch stack (100) is biased using bias voltages (VB, VG) generated by a bias generator circuit (not shown).

In practical conditions, more in particular in stacked switches experiencing large RF swings during the OFF state, each transistor within the stack will generate an undesired gate-induced drain/body leakage current (GIDL) which increases as the peak of the RF swing increases. The GIDL current flows through the body resistive ladder in the direction of arrow (110) as shown in FIG. 1A. As a result of the flow of the unwanted GIDL current, the DC voltage distribution across the body resistive ladder is modified. In other words, various switch stack nodes within the body resistive ladder will experience undesired DC bias voltages different from what the biasing circuit would have provided to such nodes in the absence of such leakage current. Throughout the disclosure, the undesired effect of GIDL current on the DC bias voltage distribution throughout the stack is referred to as the "de-biasing" effect.

The de-biasing effect is further illustrated by the curve (102) of FIG. 1B, representing exemplary DC average voltage profiles for bodies of the transistors of switch stack (100) of FIG. 1A, plotted with reference to the position of the transistors in the stack. The DC voltages at the body terminals of the FETs decrease from the top to the bottom of the stack. In other words, the voltage at the body terminal of transistor $(T_N)$ is the most positive and that of transistor $(T_1)$ is the most negative, due to the unbalanced voltage distribution resulting from the undesired GIDL current.

The body de-biasing as described above results in early breakdown of the transistors within the FET switch stacks, especially for transistors disposed closer to the top of the stacks. Additionally, the GIDL current needs to be sinked by the biasing circuits providing bias voltages to the switch stack. The higher the GIDL current, the more complex the design of a bias generator due to requirements of higher current strength capability. This may require more design area to accommodate the bias generator. Moreover, the DC current consumption of the bias circuit will also be increased.

SUMMARY

The disclosed methods and devices address the described challenges and provide practical solutions to the above-mentioned problems.

In an embodiment, a field effect transistor (FET) switch stack is disclosed comprising: serially connected FETs coupled at one end to a first terminal and at another end to a second terminal; the first terminal being configured to receive an input radio frequency (RF) signal; a body resistive ladder coupled to the first terminal, the body resistive ladder comprising a plurality of body resistors connected in series, each body resistor coupled across body terminals of corresponding adjacent FETs of the serially connected FETs; a first diode stack consisting of one or more diodes, the diode stack having a first cathode terminal connected to the first terminal and a first anode terminal connected to a body terminal of a first FET of the serially connected FETs.

In an embodiment, a field effect transistor (FET) switch stack is disclosed comprising: serially connected FETs coupled at one end to a first terminal and at another end to a second terminal; the first terminal being configured to receive an input radio frequency (RF) signal; a drain-source resistive ladder coupled to the first terminal, the drain-source resistive ladder comprising a plurality of drain-source resistors connected in series, each drain-source resistor coupled across drain-source terminals of corresponding adjacent FETs of the serially connected FETs; a first diode stack consisting of one or more diodes, the diode stack having a first anode terminal connected to the first terminal and a first cathode terminal connected to a source terminal of a first FET of the serially connected FETs.

In an embodiment, a method of driving bias voltages of a FET switch stack towards a voltage distribution across the FET switch stack is disclosed, the method comprising: generating radio-frequency (RF) voltage sources across the FET switch stack from an RF signal; and generating a current discharge path, thereby forming the voltage distribution across the FET switch stack.

Further aspects of the disclosure are provided in the description, drawings and claims of the present application.

DETAILED DESCRIPTION

Figure 1A:
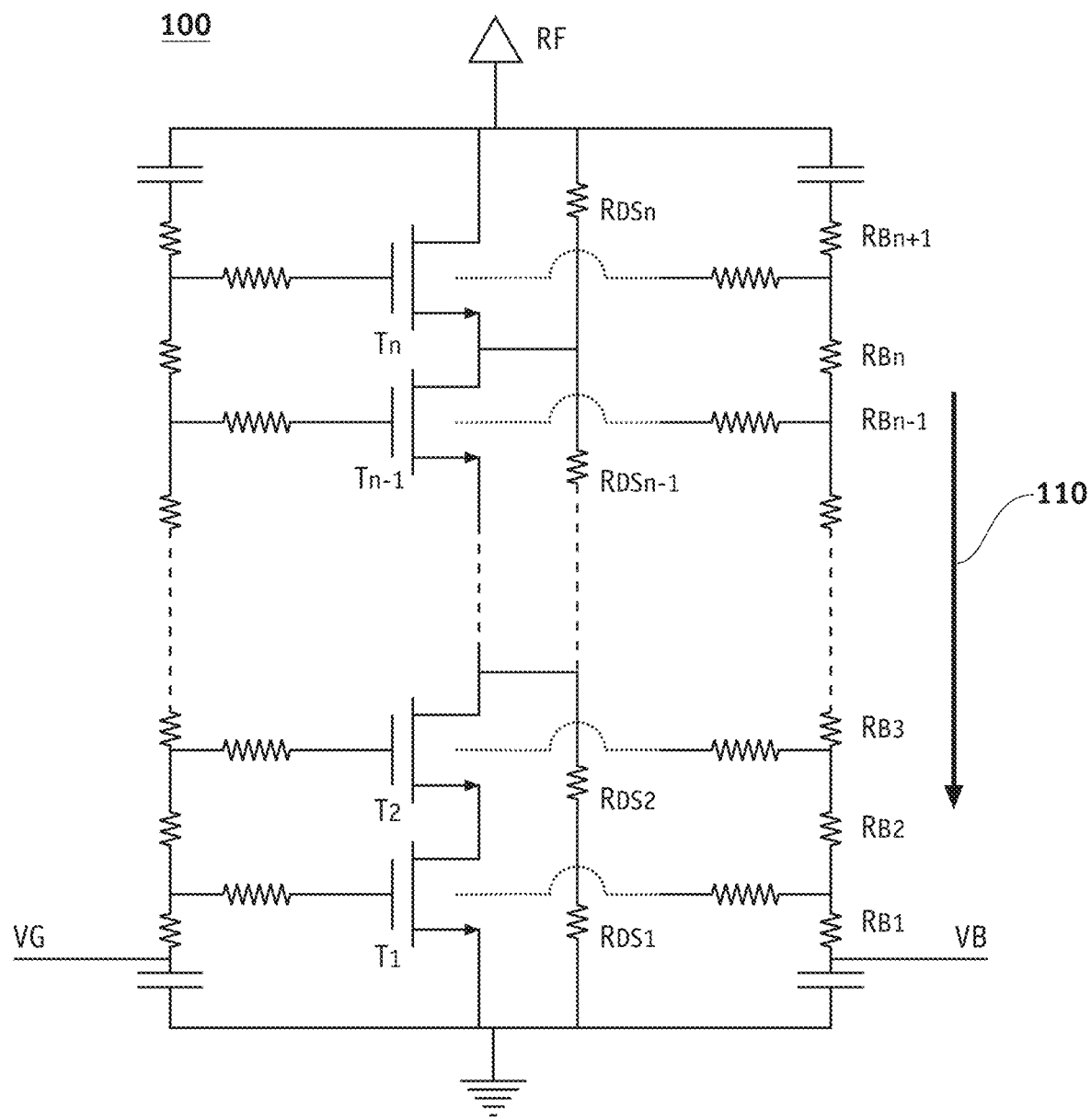
FIG. 1A shows a prior art FET switch stack.
Figure 1B:
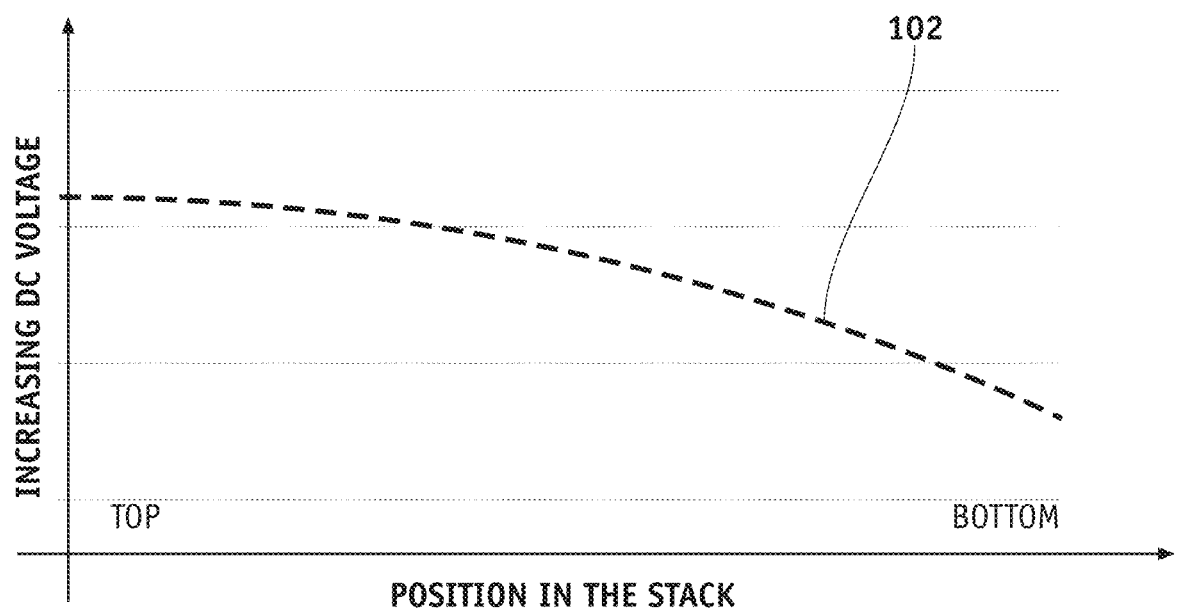
FIG. 1B shows a prior art average DC voltage profile for bodies of the transistors of a switch stack vs. position of such transistors within the stack.
Figure 2A:
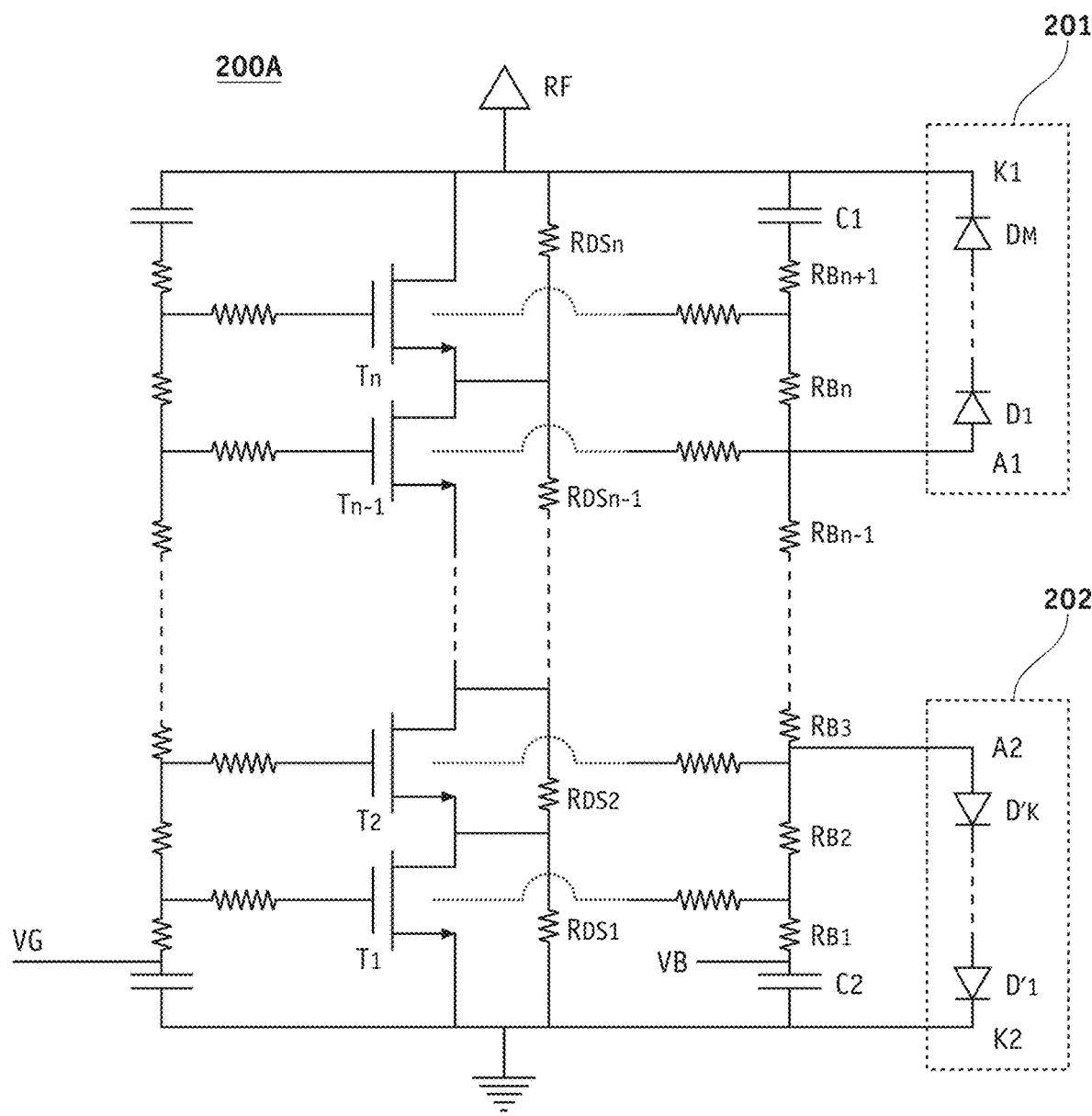
FIG. 2A shows an exemplary FET switch stack according to an embodiment of the present disclosure.

FIG. 2A shows an exemplary FET switch stack (200A), in particular a stack of at least four switches, according to an embodiment of the present disclosure. FET switch stack (200A) is coupled to RF port (RF) at one end and to a reference voltage (e.g. ground) at another end. During operative conditions, an RF signal is delivered to RF switch stack (200A) via RF port (RF). FET switch stack (200A) comprises a series arrangement of transistors ($T_1, \ldots, T_N$). This FET switch stack may be biased using a body resistive ladder including body resistors ($R_{B1}, \ldots, R_{Bn+1}$), a drain-source resistive ladder including drain-source resistors ($R_{DS1}, \ldots, R_{Dn+1}$) and a gate resistor structure on the gate side of the transistors. Also shown in FIG. 2A are bias voltages (VB, VG) used to bias FET switch stack (200A). Bias voltages (VB, VG) may be part of a bias voltage generator circuit (not shown for the sake of simplicity). In operative conditions, when FET switch stack (200A) is in OFF state, bias voltages (VB, VG) may be negative bias voltages.

With continued reference to FIG. 2A, FET switch stack (200A) comprises diode stacks (201) and (202), each coupled across one or more resistors of the body resistive ladder. According to embodiments of the present disclosure, diode stack (201) consists of one or more diodes ($D_1, \ldots D_m$) connected in series, having terminals (A1, K1) through which diode stack (201) is connected to the body resistive ladder. Furthermore, diode stack (202) consists of one or more diodes ($D'_1, \ldots, D'_k$) connected in series, having terminals (A2, K2) through which diode stack (202) is connected to the body resistive ladder. Through the present disclosure, the term diode will be used to mean not only diodes as such but also diode-connected transistors. The lowest number of diodes in series may be used in diode stack (201) as long as when maximum positive voltage RF signal is applied to FET switch stack (200A) and diode stack (201) is in OFF state, voltage across each diode's nodes in diode stack (201) is within diode's voltage reliability limit. The lowest number of diodes in series may be used in diode stack (202) as long as when maximum negative voltage RF signal is applied to FET switch stack (200A) and diode stack (202) is in OFF state, voltage across each diode's nodes in diode stack (202) is within diode's voltage reliability limit.

Other embodiments in accordance with the teachings of the present disclosure and comprising only one out of the two diode stacks (201) or (202) may also be envisaged, wherein the only one existing diode stack may have one or more diodes. In a preferred embodiment, terminal (K1) is connected to RF port (RF), terminal (A1) is connected to a node within the body resistive ladder, terminal (A2) is connected to a node within the body resistive ladder, and terminal (K2) is connected to the reference voltage (e.g. ground). Also any of resistors ($R_{B1}, \ldots, R_{Bn+1}$) may be split into two resistors. Terminal (A1) or (A2) may be connected to a node between those split resistors. As also shown in FIG. 2A, diode stacks (201, 202) may be connected with opposite polarities across the body resistive ladder. For example, as will be described in more detail later, in operative conditions, diode stack (202) conducts current in a top-to-bottom direction, while diode stack (201) conducts current in a bottom-to-top direction. As also noted above, any of the diodes within diode stacks (201) or (202) may be implemented using diode-connected transistors.

As mentioned previously, the undesired GIDL current in switch stacks generates a de-biasing issue resulting in possible early breakdown of transistors within the stack, especially the ones closer to the RF port. Moreover, the GIDL current needs to be also sinked, i.e. discharged out of the stack. With further reference to FIG. 2A, diode stack (201) addresses the de-biasing issue by sinking the GIDL current to RF port, while diode stack (202) is used to solve the problem of loading bias generator with GIDL current by sinking the GIDL current to ground.

With continued reference to FIG. 2A, FET switch stack (200A) receives an RF signal through RF port (RF). When the FET switch stack (200A) is in OFF state and during the negative swing of the RF signal, diode stack (201) turns ON, thus generating a discharge path for the GIDL current through RF port (RF). On the other hand, during the positive swing, diode stack (202) turns ON to generate a discharge path for the GIDL current through ground. The person skilled in the art will appreciate that the in-tandem use of both diode stacks (201, 202) provides also more symmetry to the structure of FET switch stack (200A), thus improving the non-linear distortion performance (e.g. reducing harmonics) of the switch stack. It is also understood that such symmetry is an optional feature and not a requirement.

In the following paragraphs:
$V_{RF+}$ and $V_{RF-}$ represent the peak positive and the peak negative applied RF voltages respectively,
$R_{B1}=R_{Bn+1}=R/2$ and $R_{B2}=R_{B3}= \ldots =R_{Ba}=R$,
$V_{RB+}$ and $V_{RB-}$ represent the peak positive and the peak negative RF voltage drop across R body resistor of the body resistive ladder respectively,
m and k represent the number of diodes in diode stacks (201, 202) respectively, where m and k may be the same or different, and Vth represents the threshold voltage of the diodes within diode stacks (201) or (202). By way of example, and not of limitation, if an RF voltage with a peak of 100V is applied to a switch stack with 25 transistors, then $V_{RB+}=100/25=4V$ and $V_{RB-}=-100/25=-4V$.

Referring back to FIG. 2A and using the above-mentioned definitions, during the negative swing of the applied RF voltage, diode stack (201) begins conducting, and therefore discharging the GIDL current, when $(X*V_{RB-})-VB<m*Vth$. Parameter X is a ratio defined based on the resistances of the body resistors across which diode stack (201) is coupled. To further clarify and as an example, for the embodiment shown in FIG. 2A, parameter X is defined as $X=(R_{Bu}+R_{Bn+1})/R_{Bn}=(R/2+R)/R=3/2$. During the positive swing of the applied RF voltage, diode stack (202) begins to conduct when $(Y*V_{RB+})+VB>k*Vth$, where Y is defined similarly to the case above as $Y=(R_{B1}+R_{B2})/R_{B2}=(R/2+R)/R=3/2$ for diode stack (202). During the positive swing of the applied RF signal, diode stack (201) is in OFF state. The reverse voltage, Vr1, across each diode within the diode stack (201) can be obtained as $Vr1=((X*V_{RB+})-VB)/m$. On the other hand, during the negative swing of the applied RF voltage, diode stack (202) is in OFF state, and the reverse voltage, Vr2, across each diode within diode stack (202) can be obtained as $Vr2=(-Y*V_{RB-})-VB)/k$. According to embodiments of the present disclosure, Vr1 and Vr2 are less than the reverse bias peak voltage reliability limit of the diodes within diode stacks (201, 202).

Figure 2B:
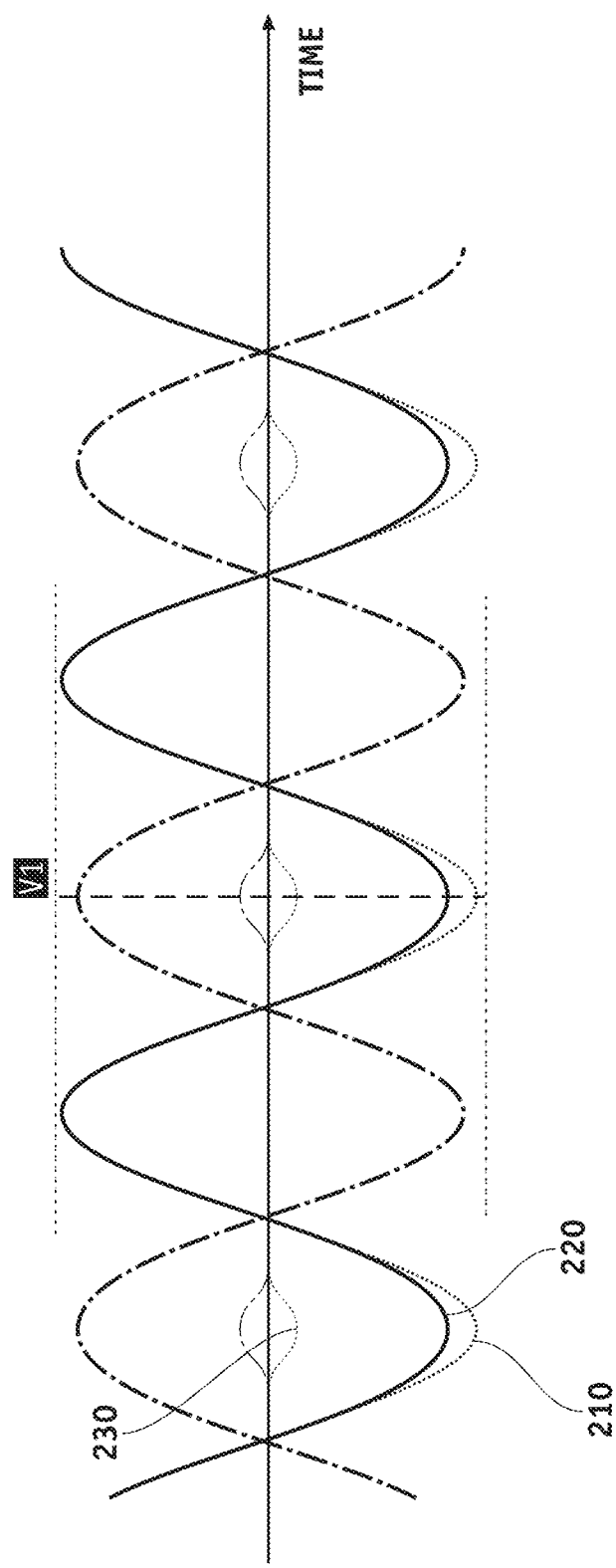
FIG. 2B shows simulation results illustrating exemplary RF signal waveforms according to an embodiment of the present disclosure.

FIG. 2B shows some simulation results illustrating the RF current running through the body resistive ladder as a function of time. Curve (210) represents the case before implementing the teachings of the disclosure (i.e. without diode stacks). As can be seen, curve (210) is asymmetric with respect to the time axis. On the other hand, curve (220) represents the case after the implementation of the diode stacks. As can be noticed, as a result of implementing the diode stacks, the RF current has become more symmetric in terms of positive peak vs negative peak behavior. Finally, curve (230) shows the difference between curves (210, 220)

to highlight the positive impact of implementing diode stacks to mitigate the negative impact of the undesired GIDL current.

Figure 2C:
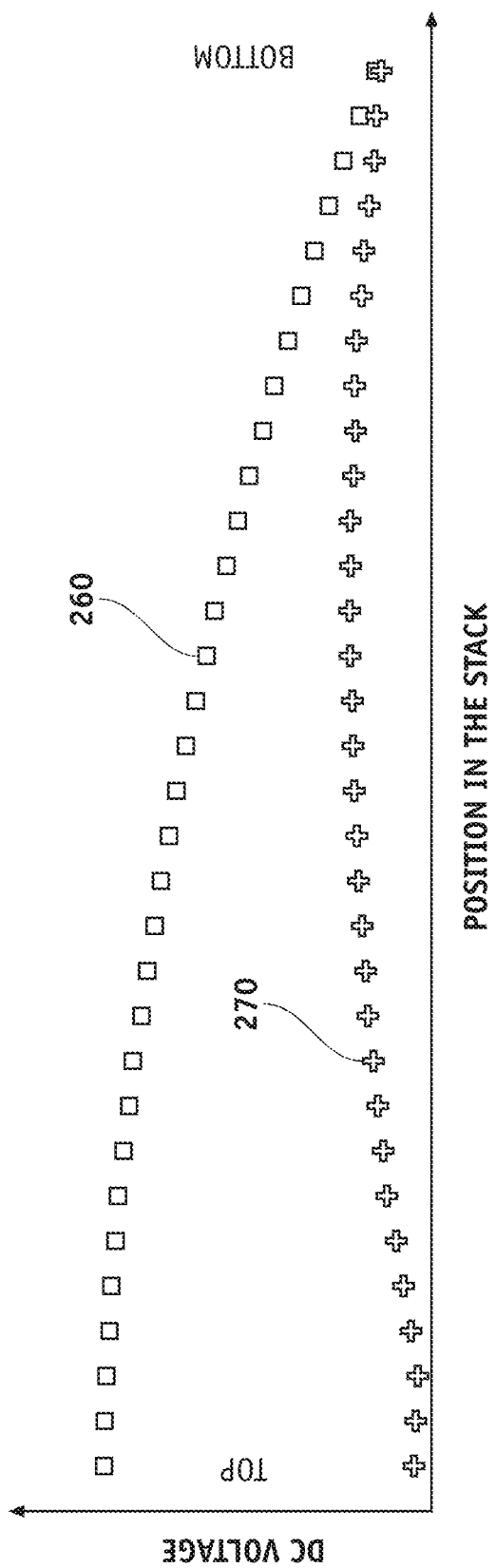
FIG. 2C shows exemplary variations of the DC voltage of the node within the body resistive ladder of a switch stack according to an embodiment of the present disclosure.

FIG. 2C shows the variation of the DC voltage of the nodes within the body resistive ladder vs. the position of such nodes within the stack. Curves (260, 270) represent such variations without and with implementation of the teachings of the present disclosure (i.e. implementing diode stacks (201, 202) of FIG. 2A) respectively. As mentioned previously, without implementation of the teachings of the disclosure, the DC voltage for each element from top to bottom drops according to a decreasing function of its position within the stack. On the other hand, with the implementation of the diode stacks, the positional element-by-element variation of the DC voltage is significantly less: the curve is more flat and the voltage distribution is more even.

Figure 3A:
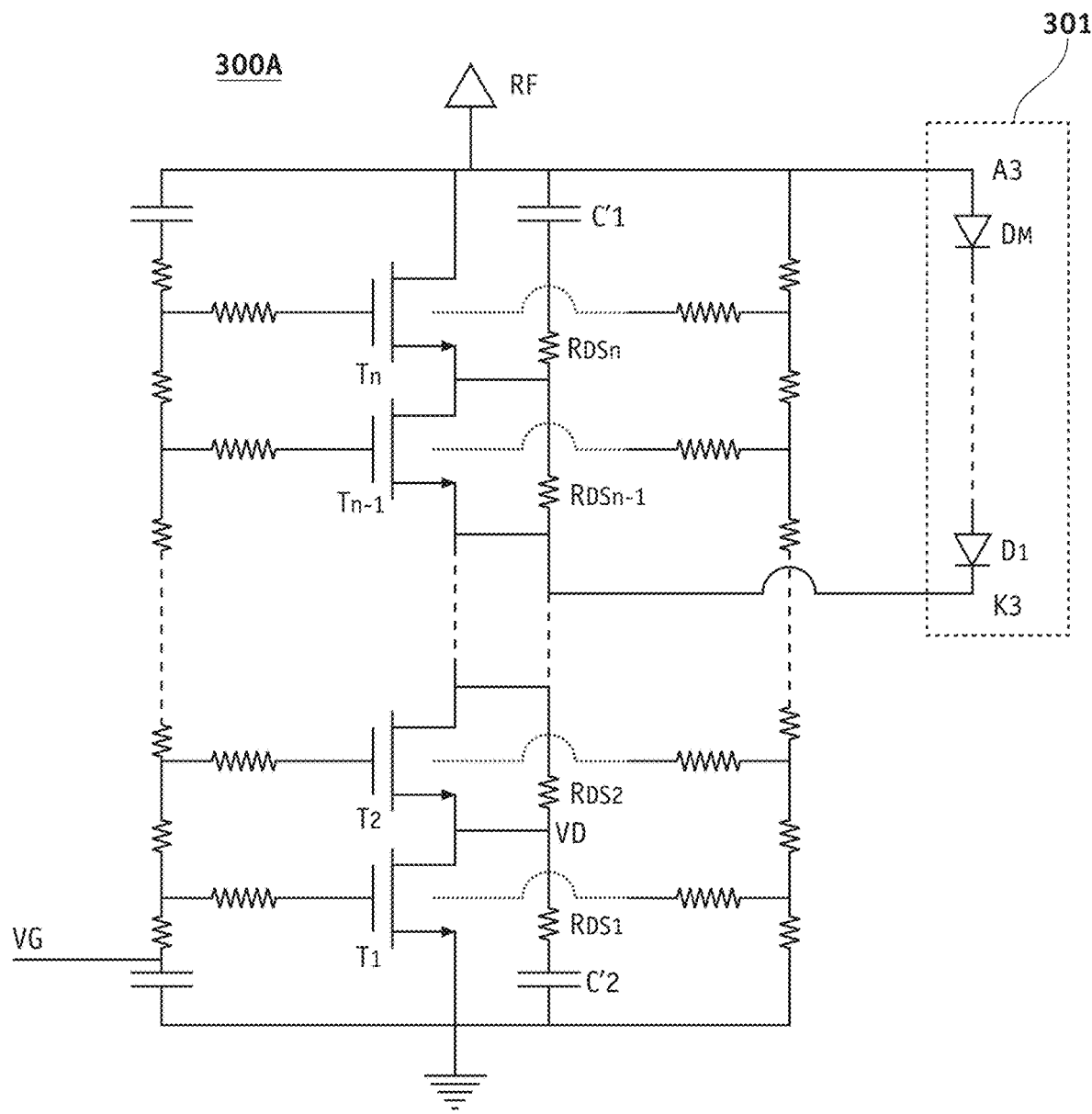
FIG. 3A shows an exemplary FET switch stack according to an embodiment of the present disclosure.

FIG. 3A shows an exemplary FET switch stack (300A), in particular a stack of at least four switches, according to a further embodiment of the present disclosure. Although there are similarities between the structure of FET switch stack (300A) and that of FET switch stack (200A) of FIG. 2A, the biasing scheme of FET switch stack (300A) is different in the sense that FET switch stack (300A) operates in positive logic. In other words, in a preferred embodiment, during operation and when FET switch stack (300A) is in OFF state, bias voltage (VG) is at 0 V and bias voltage (VD) applied to the drain-source resistive ladder is a positive bias voltage. Moreover, in the embodiment of FIG. 3A, capacitors (C1, C2) previously disposed in the body resistive ladder of FIG. 2A are now designated with ($C'_1$, $C'_2$) and disposed in the drain-source resistive ladder. Similarly to what described with regards to the embodiment of FIG. 2A, the GIDL current has the same negative effect of de-biasing FET switch stack (300A), except that the direction of current in the drain-source resistive ladder is different and is from bottom to top. The reason for such difference is that in switch stack FETs when in OFF state, the GIDL current flows into the drain terminals and out of the body terminals of the FETs. In other words, proceeding from drain-source resistor ($R_{DS1}$) to drain-source resistor ($R_{DSn}$), the average DC voltages at various nodes of the drain-source resistive ladder decrease. Also shown in FIG. 3A, is diode stack (301) which, differently from diode stack (201), is connected across one or more drain-source resistors of the drain-source resistive ladder diode stack (301) consists of a series connection of diodes ($D_1, \ldots D_m$) and has terminals (A3, K3). In a preferred embodiment, anode terminal (A3) is connected to RF port (RF) and cathode terminal (K3) is connected to a node other than ground within the drain-source resistive ladder.

With further reference to FIGS. 2A and 3A, the functionality of diode stack (301) is similar to what was previously described in regards to diode stack (201) except that such diode stacks are implemented with opposite polarities due to the fact the drain is biased at positive voltage and the current flowing in the drain-source ladder and the current flowing in the body resistive ladder have opposite directions. In operative conditions, when FET switch stack (300A) is in OFF state, during the positive swing of the applied RF signal, diode stack (301) is in ON state (conducting), thereby generating a source path through RF port (RF) for the undesired GIDL current running through drain-source resistive ladder. During the negative swing of the applied RF signal, diode stack (301) is in OFF state (non-conducting).

Figure 3B:
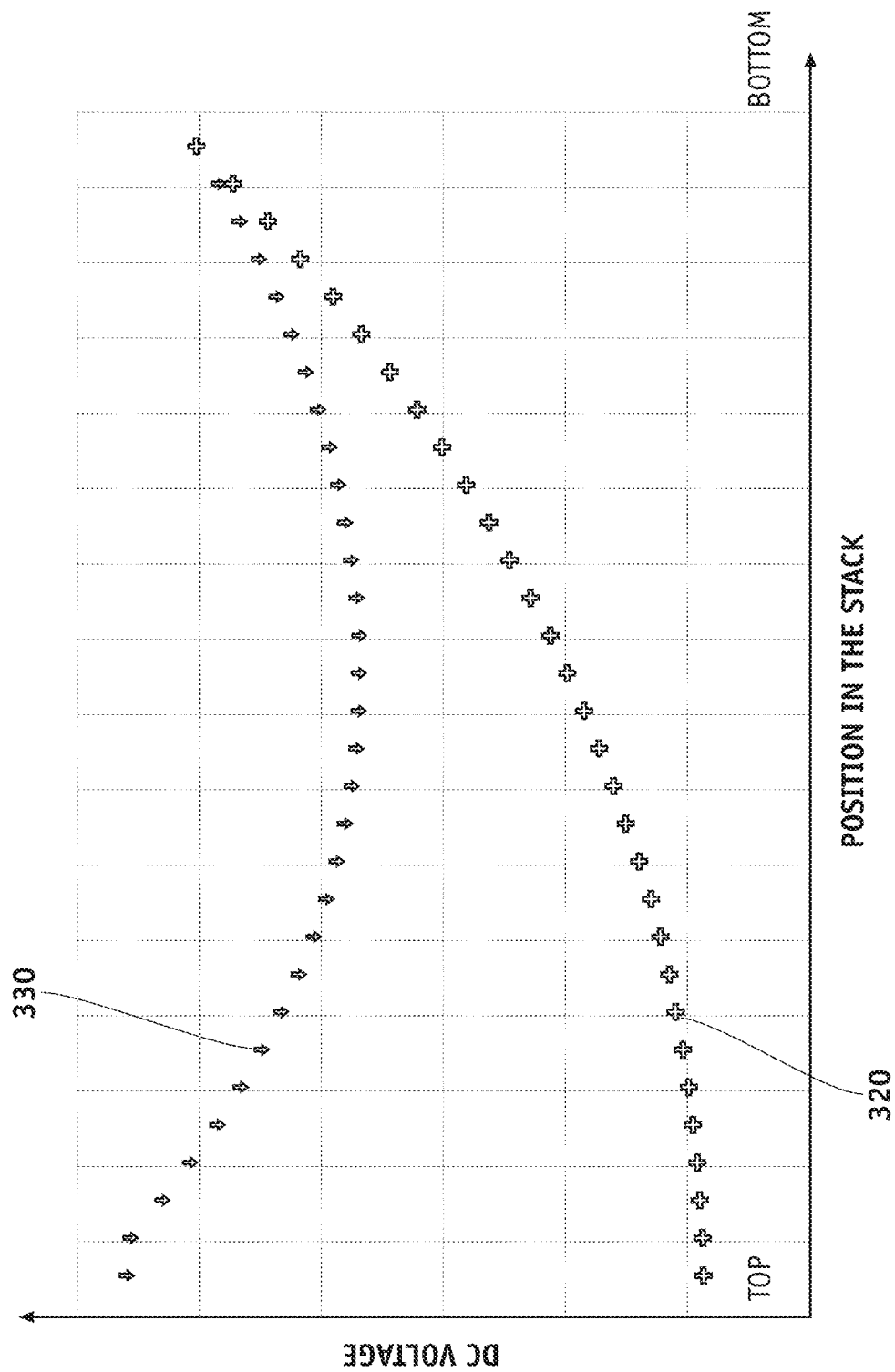
FIG. 3B shows the variation of the DC voltage of the nodes within the drain-source resistive ladder vs. the position of such nodes within an exemplary FET switch stack according to an embodiment of the present disclosure.

FIG. 3B shows the variation of the DC voltage of the nodes within the drain-source resistive ladder of FIG. 3A vs. the position of such nodes within the stack. Curves (320, 330) represent such variations without and with implementation of the teachings of the present disclosure (i.e. implementing a diode stack (301) of FIG. 3A) respectively. As mentioned previously, without implementation of a diode stack as described before, the DC voltage is an increasing function of the position within the stack. As also shown, with the implementation of the diode stack, the positional element-by-element variation of the DC voltage is significantly less: the curve is more flat and the voltage distribution is more even.

Figure 3C:
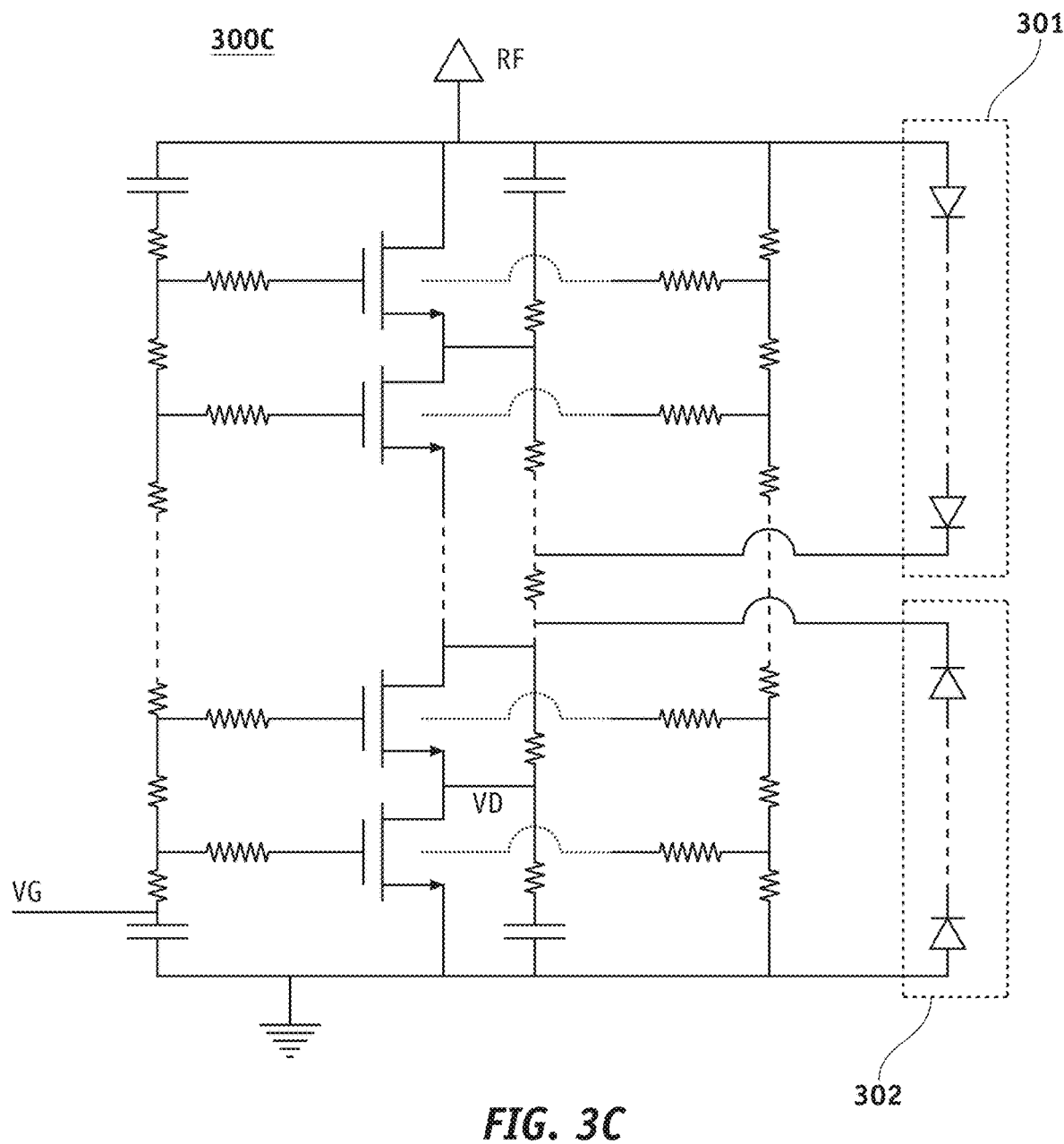
FIG. 3C shows an exemplary FET switch stack according to an embodiment of the present disclosure.

FIG. 3C shows an exemplary FET switch stack (300C), in particular a stack of at least four switches, according to a further embodiment of the present disclosure. FET switch stack (300C) functions in positive logic and the principle of its operation is similar to what was described with regards to FET switch stack (300A), except that FET switch stack (300C) further comprises diode stack (302) that is used to work in tandem with diode stack (301) to further overcome the negative impacts of the GIDL current. In operative conditions, and when FET switch stack (300C) is in OFF state, during the negative swing of the applied RF signal, diode stack (302) turns ON and provides a source path, through ground, for the undesired GIDL current. Diode stack (302) is in OFF state during the positive swing of the applied RF signal. Similarly to what was described before, the addition of stack (302) provides more symmetry to the structure, thus a better overall non-linear distortion performance.

Figure 4A:
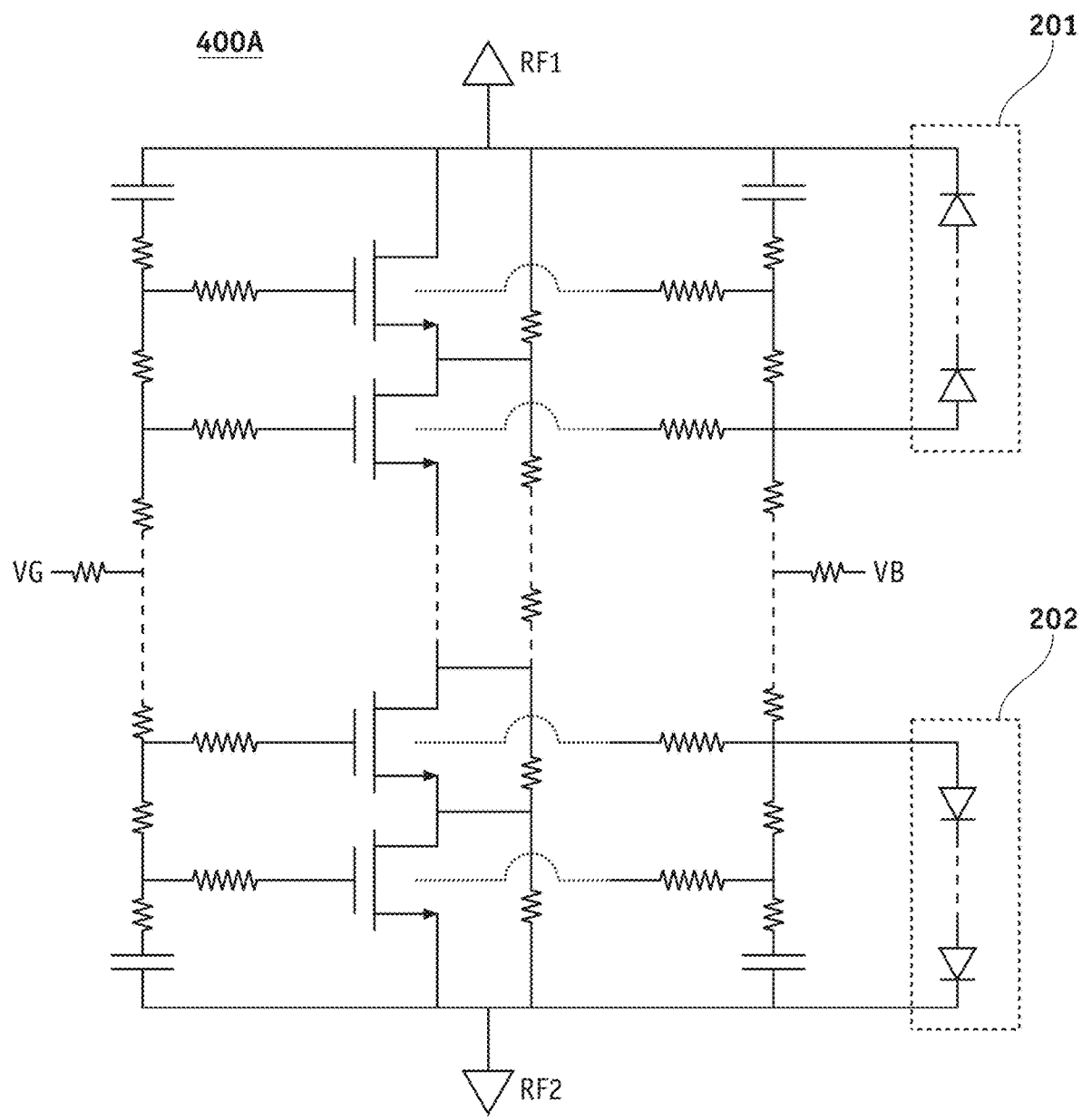
FIGS. 4A-4B show exemplary FET switch stacks implemented in series configurations according to an embodiment of the present disclosure.

In the embodiments shown in FIGS. 2A, 3A, 3C, the FET switch stacks are implemented according to a shunt configuration, i.e. between an RF terminal and a reference or ground terminal. However, the teachings of the present disclosure are equally applicable in the scenarios where the FET switch stack is implemented based on a series configuration, i.e. between two RF terminals. FIG. 4A shows a FET switch stack (400A), in particular a stack of at least four switches, in accordance with embodiments of the present disclosure. FET switch stack (400A) is essentially the same as FET switch stack (200A) of FIG. 2A but implemented in a series configuration. The RF signal is input from RF port (RF1) and output from RF port (RF2). Given the series configuration of FET switch stack (400A) and for the sake of better symmetry, bias voltages (VG, VB) are applied in the middle of the respective gate and body ladders rather than at the bottom of such ladders as in the FET switch stack (200A) of FIG. 2A. In a preferred embodiment, during operation and when FET switch stack (400A) is in OFF state, bias voltages (VG, VB) may be negative bias voltages.

Figure 4B:
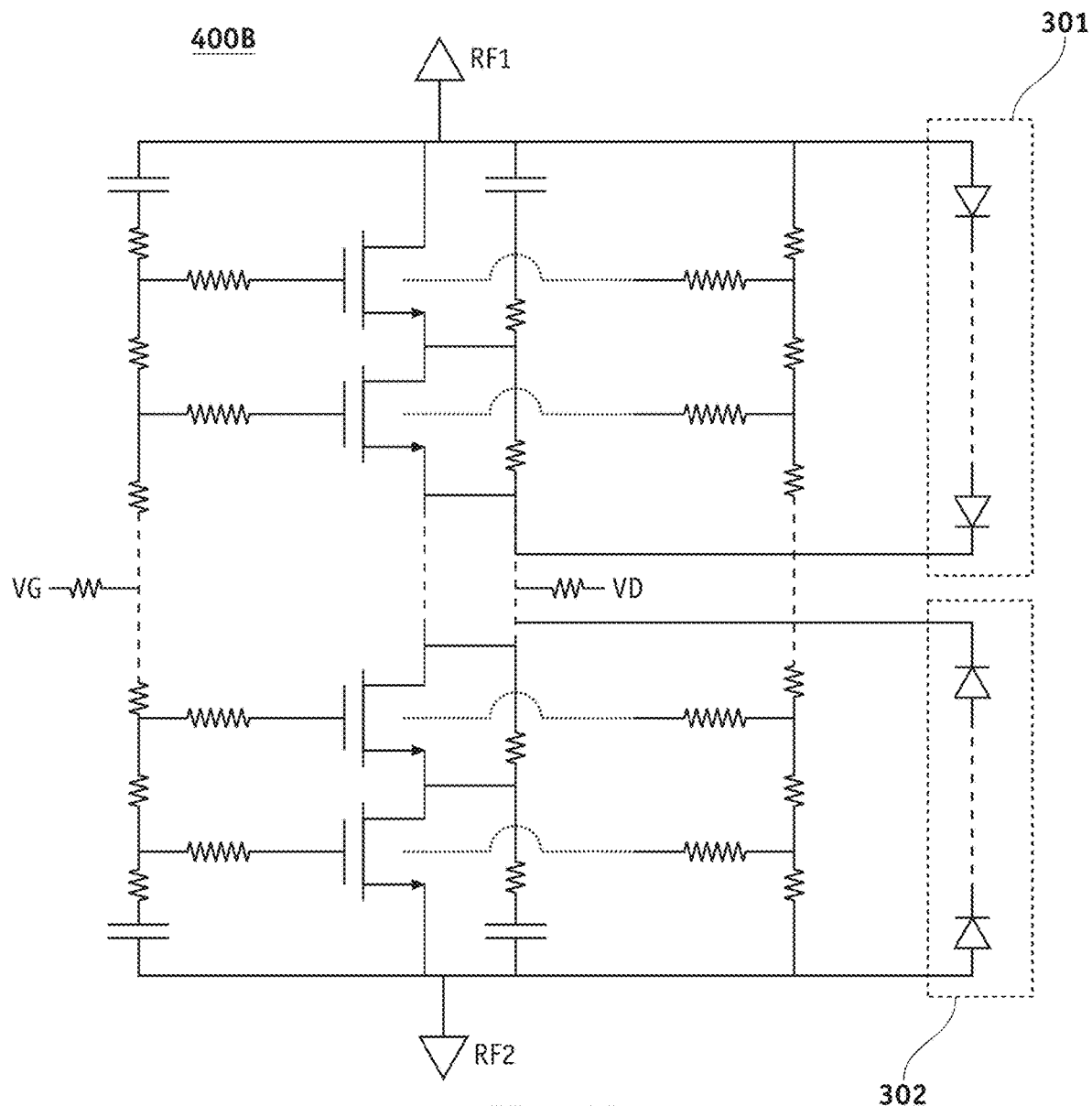

FIG. 4B shows a FET switch stack (400B), in particular a stack of at least four switches, in accordance with embodiments of the present disclosure. FET switch stack (400B) is essentially the same as FET switch stack (300C) of FIG. 3C but implemented in a RF1-RF2 series configuration. The RF signal is input from RF port (RF1) and output from RF port (RF2). Given the series configuration of FET switch stack (400B) and for the sake of better symmetry, bias voltages (VG, VD) are applied in the middle of the respective gate and drain-source ladders rather than at the bottom of such ladders as in the FET switch stack (300C) of FIG. 3C. In a preferred embodiment, during operation and when FET switch stack (400B) is in OFF state, bias voltage (VG) is about 0V and bias voltage (VD) may be a positive bias voltage.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level RF module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

As should be readily apparent to one of ordinary skill in the art, various embodiments of the invention can be implemented to meet a wide variety of specifications. Unless otherwise noted above, selection of suitable stack values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 100 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Stack voltage, current, and power handling capabilities may be adapted as needed, for example, by adjusting device sizes, serially "stacking" stacks (particularly FETs) to withstand greater voltages, and/or using multiple stacks in parallel to handle greater currents. Additional circuit stacks may be added to enhance the capabilities of the disclosed circuits and/or to provide additional functional without significantly altering the functionality of the disclosed circuits.

The invention claimed is:

1. A field effect transistor (FET) switch stack comprising:
    serially connected FETs coupled at one end to a first terminal and at another end to a second terminal; the first terminal being configured to receive an input radio frequency (RF) signal;
    a body resistive ladder coupled to the first terminal, the body resistive ladder comprising a plurality of body resistors connected in series and coupled to body terminals of the serially connected FETs;
    a first diode stack consisting of one or more diodes, the first diode stack having a first diode stack cathode terminal connected to the first terminal and a first diode stack anode terminal connected to a first node of the body resistive ladder;
    a second diode stack consisting of one or more diodes, the second diode stack having a second diode stack cathode terminal connected to the second terminal, and a second diode stack anode terminal connected to a second node of the body resistive ladder, the second node being different from the first node;
    the FET switch stack being configured to receive a body bias voltage at a body bias terminal, the body bias terminal being coupled to the body terminals of the serially connected FETs through the body resistive ladder;
    wherein, in an OFF state of the FET switch stack:
    i) the first diode stack is configured to be:
        in a conducting state during a negative RF swing of the RF signal, generating a first discharge path through the first terminal, from the first diode stack anode terminal to the first diode stack cathode terminal for a gate-induced body leakage current from the body terminals of the serially connected FETs, the first diode stack anode terminal configured to be at a first voltage, the first discharge path from the first diode stack anode terminal to the first diode stack cathode terminal being common to all of the serially connected FETs; and
        in a non-conducting state during a positive RF swing of the RF signal, and
    ii) the second diode stack is configured to be:
        in a conducting state during a positive RF swing of the input RF signal, thus generating a second discharge path through the second terminal, from the second diode stack anode terminal to the second diode stack cathode terminal for the gate-induced body leakage current from the body terminals of the serially connected FETs, the second diode stack anode terminal configured to be at a second voltage different from the first voltage, the second discharge path from the second diode stack anode terminal to the second diode stack cathode terminal being common to all of the serially connected FETs; and
        in a non-conducting state during a negative RF swing of the input RF signal,
    and wherein, in the OFF state of the FET switch stack, for the gate-induced body leakage current from a body terminal of a given FET of the serially connected FETs, iii) the discharge path for the gate-induced body leakage current of the given FET through the first diode stack during the negative RF swing of the RF signal is at a first anode potential, defined by the first voltage of the first diode stack anode terminal, and iv) the discharge path for the gate-induced body leakage current of the given FET through the second diode stack during the positive RF swing of the RF signal is at a second anode potential, defined by the second voltage of the second diode stack anode terminal, the second anode potential being different from the first anode potential.

2. The FET switch stack of claim 1, wherein the serially connected FETs are four or more serially connected FETs.

3. The FET switch stack of claim 1, configured to receive a gate bias voltage at a gate bias terminal of the FET switch stack, the gate bias terminal being coupled through a resistor to a gate of a bottom FET closest to the second terminal.

4. The FET switch stack of claim 1, wherein, in the OFF state of the FET switch stack, the gate bias voltage and the body bias voltage are negative bias voltages.

5. The FET switch stack of claim 1, wherein the body resistive ladder comprises a first capacitor closest to the first terminal and connected to the first terminal, and a second capacitor closest to the second terminal and connected to the second terminal.

6. The FET switch stack of claim 1, wherein the second terminal is connected to a reference voltage or ground.

7. The FET switch stack of claim 1, wherein the second terminal is configured as an output RF port.

8. The FET switch stack of claim 7, configured to receive a gate bias voltage at a gate bias terminal, the gate bias terminal being coupled through a resistor to a gate of a middle FET of the serially connected FETs.

9. The FET switch stack of claim 8, wherein, in the OFF state of the FET switch stack, the pate bias voltage and the body bias voltage are negative bias voltages.

10. A field effect transistor (FET) switch stack comprising:
serially connected FETs coupled at one end to a first terminal and at another end to a second terminal; the first terminal being configured to receive an input radio frequency (RF) signal;
a drain-source resistive ladder coupled to the first terminal, the drain-source resistive ladder comprising a plurality of drain-source resistors connected in series, each drain-source resistor coupled across drain-source terminals of corresponding adjacent FETs of the serially connected FETs;
a first diode stack consisting of one or more diodes, the first diode stack having a first anode terminal connected to the first terminal and a first cathode terminal connected to a source terminal of a first FET of the serially connected FETs, and
a second diode stack consisting of one or more diodes, the second diode stack having a second anode terminal connected to the second terminal, and a second cathode terminal connected to a drain terminal of a second FET of the serially connected FETs;
wherein the first and the second diode stacks are configured to form discharge paths for a gate induced drain leakage current generated by the FET switch stack when in an OFF state.

11. The FET switch stack of claim 10, wherein:
in the OFF state of the FET switch stack, the first diode stack is configured to be:
in a conducting state during a positive RF swing of the input RF signal, generating a source path through the first terminal for a gate-induced drain leakage current; and
in a non-conducting state during a negative RF swing of the input RF signal.

12. The FET switch stack of claim 10, wherein the serially connected FETs are four or more serially connected FETs.

13. The FET switch stack of claim 10, wherein:
in the OFF state of the FET switch stack, the second diode stack is configured to be:
in a conducting state during a negative RF swing of the input RF signal, thus generating an additional source path through the second terminal for the gate-induced drain leakage current, and
in a non-conducting state during a positive RF swing of the input RF signal.

14. The FET switch stack of claim 13, configured to receive a first bias voltage at a gate bias terminal and a second bias voltage at a drain bias terminal, the gate bias terminal being coupled through a resistor to a gate of a bottom FET closest to the second terminal, and the drain bias terminal coupled to a drain terminal of the bottom FET.

15. The FET switch stack of claim 14, wherein in an OFF state of the FET switch stack, the first bias voltage is at zero volts, and the second bias voltage is a positive bias voltage.

16. The FET switch stack of claim 10, wherein the drain-source resistive ladder comprises a first capacitor closest to the first terminal and connected to the first terminal, and a second capacitor closest to the second terminal and connected to the second terminal.

17. The FET switch stack of claim 15, wherein the second terminal is connected to a reference voltage or ground.

18. The FET switch stack of claim 13, wherein the second terminal is configured as an output RF port.

19. The FET switch stack of claim 18, configured to receive a first bias voltage at a gate bias terminal and a second bias voltage at a drain bias terminal, the gate bias terminal being coupled through a resistor to a gate of a middle FET of the serially connected FETs, and the drain bias terminal coupled to a drain terminal of the middle FET.

20. The FET switch stack of claim 19, wherein in an OFF state of the FET switch stack, the first bias voltage is at zero volts, and the second bias voltage is a positive bias voltage.

21. An RF module comprising the FET switch stack of claim 1.

22. A communications device comprising the FET switch stack of claim 1.

23. The FET switch stack of claim 1, further comprising a first resistor of the body resistive ladder between the first anode terminal of the first diode stack and the body terminal of the first FET, and a second resistor of the body resistive ladder between the second anode terminal of the second diode stack and the body terminal of the second FET.

24. The FET switch stack of claim 1, wherein an electrical connection between a gate terminal and a body terminal of each FET of serially connected FETs in the OFF state is the same as the electrical connection between the gate terminal and the body terminal of said each FET in an ON state.

* * * * *